United States Patent
Chang et al.

(10) Patent No.: US 7,112,820 B2
(45) Date of Patent: Sep. 26, 2006

(54) STACKED CAPACITOR HAVING PARALLEL INTERDIGITIZED STRUCTURE FOR USE IN THIN FILM TRANSISTOR LIQUID CRYSTAL DISPLAY

(75) Inventors: Chih-Chin Chang, Hsin-Chu (TW); Kuang-Chao Yeh, Tao-Yuan Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 247 days.

(21) Appl. No.: 10/605,015

(22) Filed: Sep. 1, 2003

(65) Prior Publication Data
US 2004/0259359 A1 Dec. 23, 2004

(30) Foreign Application Priority Data
Jun. 20, 2003 (TW) .............................. 92116888 A

(51) Int. Cl.
G02F 1/136 (2006.01)
(52) U.S. Cl. .................... 257/72; 257/E33.062; 349/38
(58) Field of Classification Search ................ 257/306, 257/307, 59, 72
See application file for complete search history.

(56) References Cited

U.S. PATENT DOCUMENTS 5,182,661 A * 1/1993 Ikeda et al. .................... 349/38
6,259,149 B1 * 7/2001 Burkhardt et al. .......... 257/534

FOREIGN PATENT DOCUMENTS

JP    H09-162412    6/1997
JP    2001-265253   9/2001

* cited by examiner

Primary Examiner—Eddie Lee
Assistant Examiner—Andrew O. Arena
(74) Attorney, Agent, or Firm—Winston Hsu

(57) ABSTRACT

A capacitor structure includes a first conductive layer, a first insulating layer disposed on a substrate in sequence, a second conductive layer disposed on portions of the first insulating layer, a second insulating layer disposed on the second conductive layer and the first insulating layer, a third conductive layer disposed on portions of the second insulating layer, a third insulating layer disposed on the third conductive layer and the second insulating layer, and a fourth conductive layer disposed on the third insulating layer. The third conductive layer and the fourth conductive layer are electrically connected to the first conductive layer and the second conductive layer through at least one first contact hole adjacent to the second conductive layer and at least one second contact hole, respectively.

21 Claims, 4 Drawing Sheets

STACKED CAPACITOR HAVING PARALLEL INTERDIGITIZED STRUCTURE FOR USE IN THIN FILM TRANSISTOR LIQUID CRYSTAL DISPLAY

BACKGROUND OF INVENTION

1. Field of the Invention

The present invention relates to a capacitor structure, and more particularly, to a capacitor structure applied to a thin film transistor liquid crystal display (TFT-LCD) to improve contrast of the display by increasing capacitance value and aperture ratio.

2. Description of the Prior Art

Currently, liquid crystal displays(LCDs)area mature flat panel display technology. Applications for liquid crystal displays are extensive and include mobile phones, digital cameras, video cameras, notebooks, and monitors. Due to high quality display requirements and the expansion of new application fields, the LCD has developed toward high quality, high resolution, high brightness, and low price. A low temperature polysilicon thin film transistor liquid crystal display (LTPS-TFTLCD) is one type of thin film transistor liquid crystal display. The low temperature polysilicon thin film transistor liquid crystal display, being actively driven, is a break-through in achieving the above objectives. Furthermore, the metal-oxide-semiconductors and the low temperature polysilicon thin film transistorsused in this technique are integrated in the same manufacturing process to fabricate a system on panel (SOP). Therefore, technological innovation based on this concept has become an important subject for further development.

A thin film transistor liquid crystal display (TFT-LCD) utilizes thin film transistors (TFTs) as switches of active matrix to control the charges of pixel electrodes. By rotating the liquid crystal molecules of the liquid crystal unit in the pixel to expected angles, the amount of light passing through the pixel is controlled. Referring to FIG. 1, FIG. 1 is an equivalent circuit diagram of a pixel 20 in a TFT-LCD. As shown in FIG. 1, the pixel 20 comprises a liquid crystal unit (LC) electrically connected to a common counter electrode (CE) and a thin film transistor 22. A gate electrode 24 of the thin film transistor 22 is electrically connected to a scan line $G_0$, a drain electrode 26 of the thin film transistor 22 is electrically connected to a signal line $D_0$, and a source electrode 28 of the thin film transistor 22 is electrically connected to a pixel electrode (not shown) of the LC. The pixel 20 further comprises a storage capacitor (SC) electrically connected between the LC and a scan line $G_1$. Since the capacitor can increase or decrease the amount of charge by charging or discharging depending on the variation of voltage, the storage capacitor SC is not only used to reduce the voltage variation of the LC due to leakage current, but also is used to assist the LC with storing electric charges. The turned-on time for the pixel 20 is thus lengthened.

Referring to FIG. 2, FIG. 2 is a structural schematic diagram of a thin film transistor liquid crystal display 30 according to the prior art. As shown in FIG. 2, the prior art thin film transistor liquid crystal display 30 comprises a substrate 32. The substrate 32, composed of transparent materials, is an insulating substrate, and the substrate 32 comprises a glass substrate, a quartz substrate, or a plastic substrate. A pixel array area 33 and a periphery circuit area 34 are included on a surface of the substrate 32. A thin film transistor area (TFT area) 35, a capacitor area 36, and an aperture region 37 are included in the pixel array area 33. The thin film transistor area 35 is used for disposing a thin film transistor 38, and the capacitor area 36 is used for disposing a storage capacitor 42. Since a gate 44 of the thin film transistor 38 is composed of a low temperature polysilicon material, the thin film transistor 38 is a low temperature polysilicon thin film transistor.

The storage capacitor 42 comprises a first insulating layer 46 disposed on the substrate 32, a first metal layer 48 disposed on the first insulating layer 46, a second insulating layer 52 disposed on the first metal layer 48, a second metal layer 54 disposed on the second insulating layer 52, a third insulating layer 56 disposed on the second metal layer 54, and an organic coating 58 disposed on the third insulating layer 56. A contact hole 62 is included in the organic layer 58 and the third insulating layer 56 to expose portions of the second metal layer 54. A transparent conductive layer 64, extending into the contact hole 62, is disposed on the organic layer 58 and connected to the second metal layer 54.

Both the first insulating layer 46 and the second insulating layer 52 are silicon oxide layers. The first metal layer 48 and the second metal layer 54 may each be a tungsten layer (W layer) or a chrome layer (Cr layer). The third insulating layer 56 is a silicon nitride layer. The organic layer 58, formed by a spin coating method, is an organic material layer. The transparent conductive layer 64 comprises an indium tin oxide layer (ITO layer) or an indium zinc oxide layer (IZO layer). The first metal layer 48 is used as the bottom electrode plate of the storage capacitor 42, the second metal layer 54 is used as the top electrode plate of the storage capacitor 42, and the second insulating layer 52 is used as the capacitor dielectric layer of the storage capacitor 42.

However, the prior art capacitor 42 applied to the thin film transistor liquid crystal display 30 is essential barring any break though. The capacitance value of a capacitor directly reflects its charge storage ability. The larger the area of the electrode plate is, the higher the capacitance value is. In other words, the number of charges stored by the capacitor is proportional to the area of the electrode plate. Although the capacitor has a large area electrode plate and can store more charges to lengthen the turned-on time for the pixel, a large area is occupied by the capacitor to reduce the aperture ratio. Therefore, not only is the maximum brightness of the liquid crystal display limited, the overall contrast is reduced. Under the limitation of insufficient aperture ratio in the pixel, special processing or consideration is required when designing or producing products to result in raised cost, leading to uncompetitive products.

Therefore, it is very important to develop a new capacitor structure having a small area to store a specific number of charges so as to improve the contrast of the liquid crystal display when applied to the thin film transistor liquid crystal display. Furthermore, current processing should not need to be changed when fabricating the capacitor structure to produce competitive products.

SUMMARY OF INVENTION

It is therefore one object of the present invention to provide a capacitor structure, especially a capacitor structure applied to a thin film transistor liquid crystal display, to improve contrast of the display by increasing capacitance value and aperture ratio.

According to one aspect of the present invention, a capacitor structure is provided. The capacitor structure comprises a substrate, a first conductive layer disposed on the substrate, a first insulating layer disposed on the first conductive layer, a second conductive layer disposed on portions of the first insulating layer, a second insulating layer disposed on the second conductive layer and the first insulating layer, a third conductive layer disposed on portions of the second insulating layer, a third insulating layer disposed on the third conductive layer and the second insulating layer, and a fourth conductive layer disposed on the third insulating layer. The third conductive layer and the fourth conductive layer are electrically connected to the first conductive layer and the second conductive layer through at least one first contact hole adjacent to the second conductive layer and at least one second contact hole, respectively.

It is an advantage that the present invention capacitor structure replaces the conventional planer capacitor of two-layered electrode plates with three stacked capacitors of four prior art conductive layers in conjunction as four-layered electrode plates. Since these three capacitors are connected in parallel with one another, the capacitance value of the equivalent capacitor is equal to the sum of the capacitance values of these three capacitors. The area of the present invention capacitor structure is thus only approximately one third of the area of the prior art capacitor structure used to store the same number of charges. Therefore, not only is the aperture ratio of the pixel increased, but also the maximum brightness of the liquid crystal display is improved correspondingly to improve the insufficient overall contrast phenomenon frequently occurring in the prior art. In addition, because the present invention capacitor structure utilizes the four conductive layers of the prior art, no extra cost is incurred due to special treatment or consideration to fabricate very competitive products, when applying the present invention capacitor structure to low temperature polysilicon thin film transistor liquid crystal displays or other products.

These and other objectives of the present invention will become apparent to those of ordinary skill in the art after having read the following detailed description of the preferred embodiments illustrated in the various drawings.

DETAILED DESCRIPTION

Figure 1:
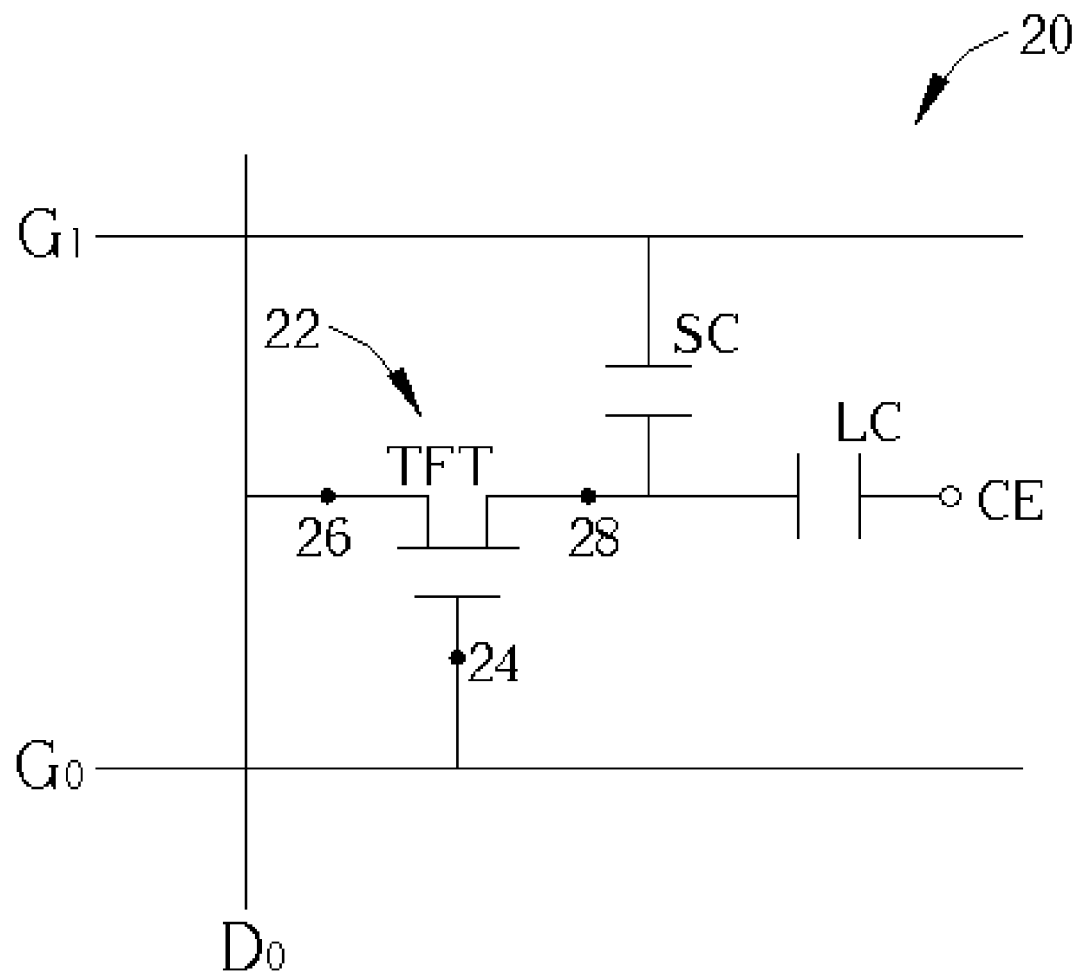
FIG. 1 is an equivalent circuit diagram of a pixel in a TFT-LCD.
Figure 2:
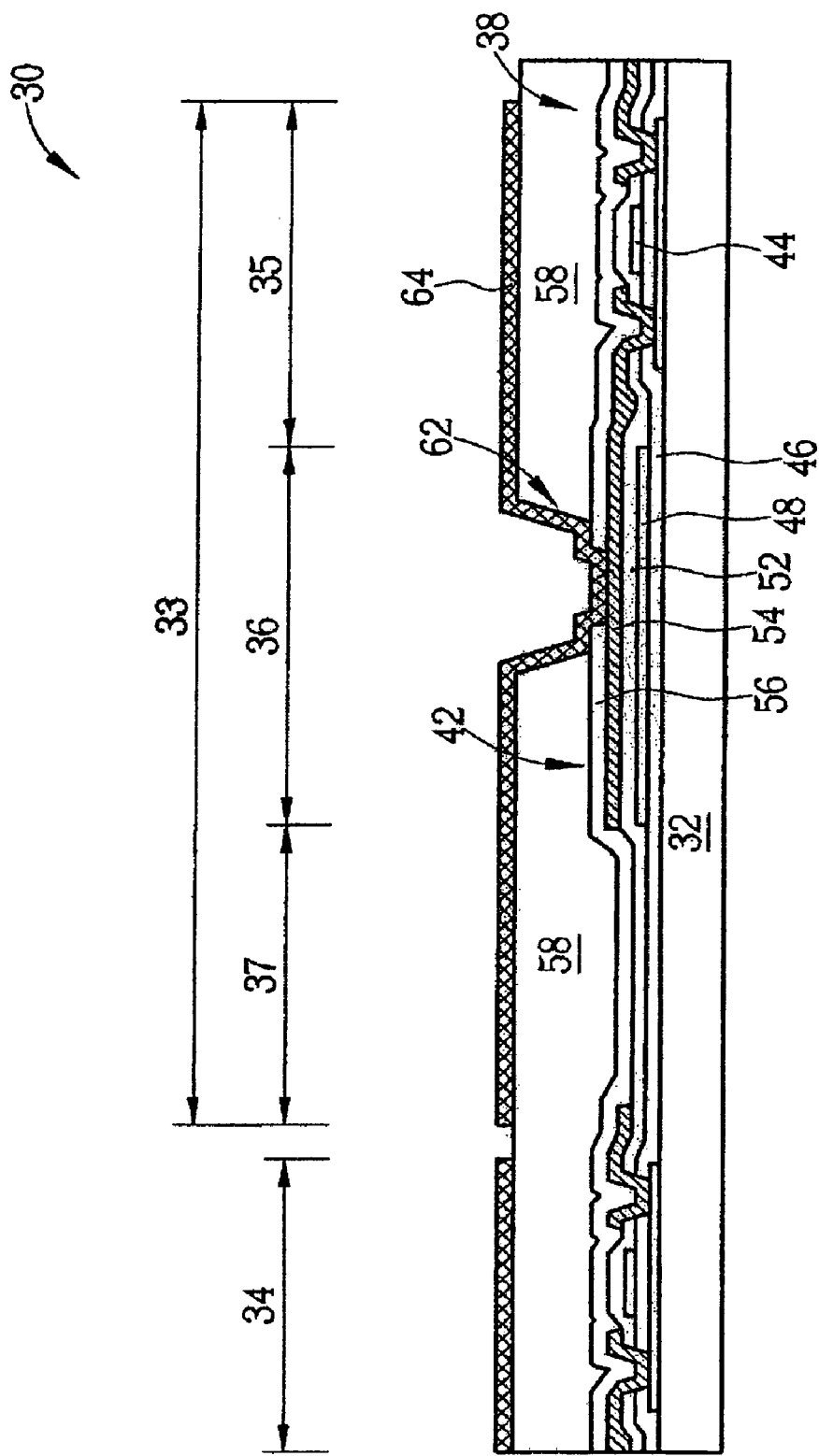
FIG. 2 is a structural schematic diagram of a thin film transistor liquid crystal display according to the prior art.
Figure 3:
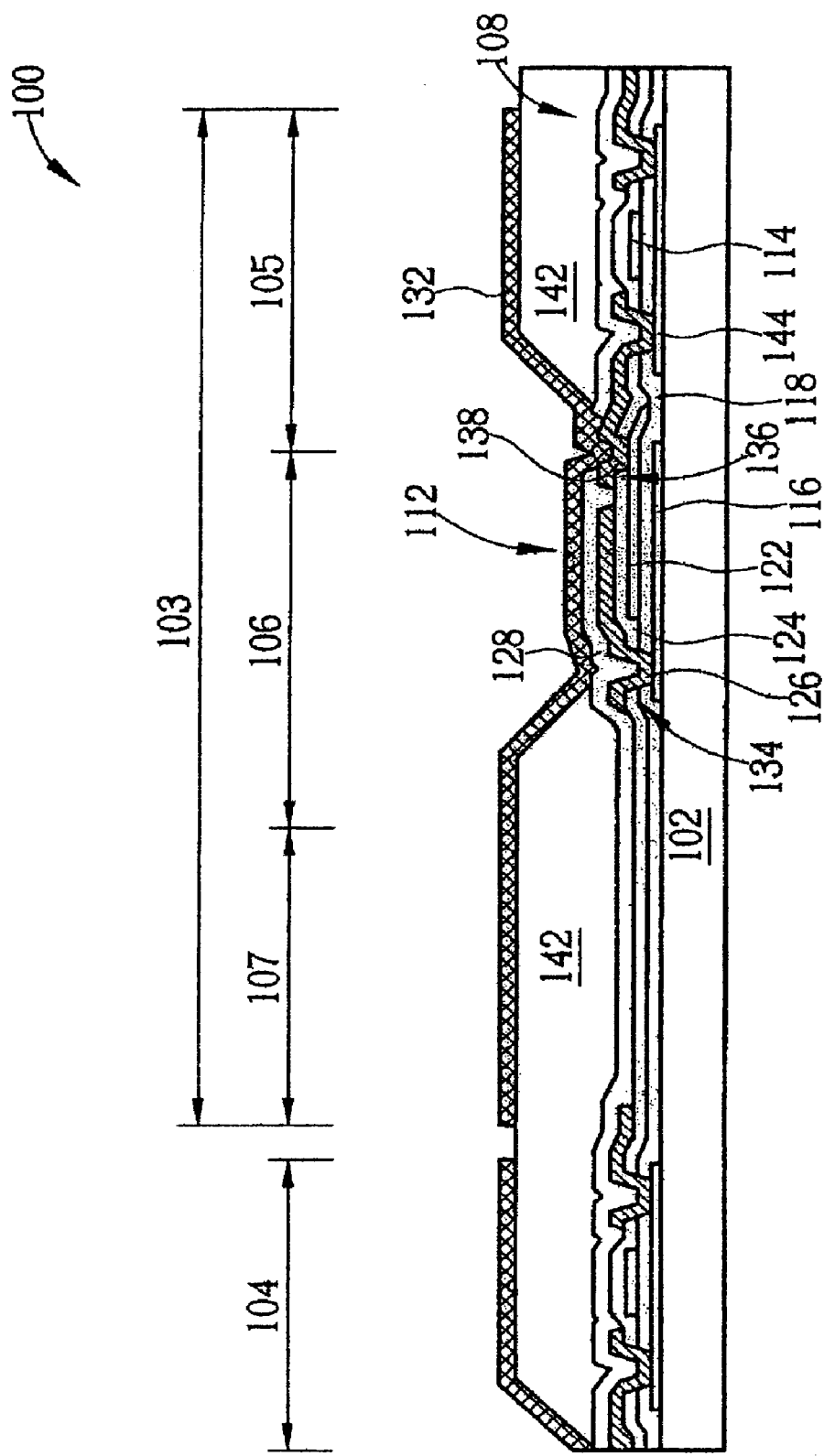
FIG. 3 is a structural schematic diagram of a thin film transistor liquid crystal display according to the present invention.

Referring to FIG. 3, FIG. 3 is a structural schematic diagram of a thin film transistor liquid crystal display 100 according to the present invention. As shown in FIG. 3, the present invention thin film transistor liquid crystal display 100 comprises a substrate 102. The substrate 102, composed of transparent materials, is an insulating substrate, and the substrate 102 comprises a glass substrate, a quartz substrate, or a plastic substrate. A pixel array area 103 and a periphery circuit area 104 are included on a surface of the substrate 102. A thin film transistor area 105, a capacitor area 106, and an aperture region 107 are included in the pixel array area 103. The thin film transistor area 105 is used for disposing a thin film transistor 108, and the capacitor area 106 is used for disposing a storage capacitor 112. Since a gate 114 of the thin film transistor 108 is composed of a low temperature polysilicon material, the thin film transistor 108 is a low temperature polysilicon thin film transistor.

The storage capacitor 112 comprises a first conductive layer 116 disposed on the substrate 102, a first insulating layer 118 disposed on the first conductive layer 116, a second conductive layer 122 disposed on portions of the first insulating layer 118, a second insulating layer 124 disposed on the second conductive layer 122 and the first insulating layer 118, a third conductive layer 126 disposed on portions of the second insulating layer 124, a third insulating layer 128 disposed on the third conductive layer 126 and the second insulating layer 124, and a fourth conductive layer 132 disposed on the third insulating layer 128. The third conductive layer 126 is electrically connected to the first conductive layer 116 through at least one first contact hole 134. The first contact hole 134 is adjacent to the second conductive layer 122. The fourth conductive layer 132 is electrically connected to the second conductive layer 122 through at least one second contact hole 136.

The first conductive layer 116, the first insulating layer 118, and the second conductive layer 122 form a first capacitor, the second conductive layer 122, the second insulating layer 124, and the third conductive layer 126 form a second capacitor, and the third conductive layer 126, the third insulating layer 128, and the fourth conductive layer 132 form a third capacitor. The first conductive layer 116 is a polysilicon layer. The first insulating layer 118 comprises a silicon oxide layer ($SiO_x$ layer, where $0<x<2.0$), a silicon nitride layer ($SiN_y$ layer, where $0<y<1.33$), or a silicon oxynitride layer ($SiO_x N_y$ layer, where $0<x<2.0$, $0<y<1.33$). Each of the second conductive layer 122 and the third conductive layer 126 is a metal layer, an alloy layer, or a metal multi-layer. The metal layer comprises a tungsten layer, a chrome layer, a titanium layer (Ti layer), an aluminum layer (Al layer), a niobium layer (Nb layer), or a molybdenum layer (Mo layer). The alloy layer comprises an aluminumneodymium layer (AlNd layer). The metal multi-layer comprises a titanium/aluminum/titanium layer (Ti/Al/Ti layer), a molybdenum/aluminum/molybdenum layer (Mo/Al/Mo layer), or a chrome/aluminum (Cr/Al layer).

Each of the second insulating layer 124 and the third insulating layer 128 comprise a silicon oxide layer, a silicon nitride layer, or a silicon oxynitride layer. The fourth conductive layer 132 comprises an indium tin oxide layer or an indium zinc oxide layer. The first contact hole 134 is disposed in the first insulating layer 118 and the second insulating layer 124 to expose portions of the first conductive layer 116. The second contact hole 136 is disposed in the second insulating layer 124 to expose portions of the second conductive layer 122.

The third conductive layer 126, extending into the first contact hole 134, is connected to the first conductive layer 116 so that the first conductive layer 116 and the third conductive layer 126 are electrically connected to each other. A fifth conductive layer 138 is included on the substrate 102, and the fifth conductive layer 138 is disposed in the second contact hole 136 to electrically connect the fourth conductive layer 132 to the second conductive layer 122. The third conductive layer 126 and the fifth conductive layer 138 are formed by patterning a same metal layer. Because the third conductive layer 126 is not connected to the fifth conductive layer 138, the problem of short circuits between the first capacitor, the second capacitor, and the third capacitor will not occur.

It is worth noting that the fourth conductive layer 132 extends to the entire aperture region 107, the entire thin film transistor area 105, and the entire periphery circuit area 104. The fourth conductive layer 132 is electrically isolated from other structures, such as thin film transistors, metal layers, or conductive layers, by an organic layer 142 disposed on the substrate 102. The fourth conductive layer 132 extending to the thin film transistor area 105 is used as a pixel electrode (not shown) of a liquid crystal unit (not shown). In addition, the organic layer 142, formed by a spin coating method, is an organic material layer. The fifth conductive layer 138 extends to the thin film transistor area 105 to electrically connect the fourth conductive layer 132 to a drain 144 of the thin film transistor 108. In fact, the fifth conductive layer 138 is a signal line (not shown), and the fifth conductive layer 138 together with a scan line (not shown), electrically connected to the gate 114, are used to control the turn-on and turn-off of the thin film transistor 108. The charge of the pixel electrode (not shown) is thus controlled to rotate the liquid crystal molecules (not shown) filled in the liquid crystal unit (not shown) to expected angles.

Figure 4:
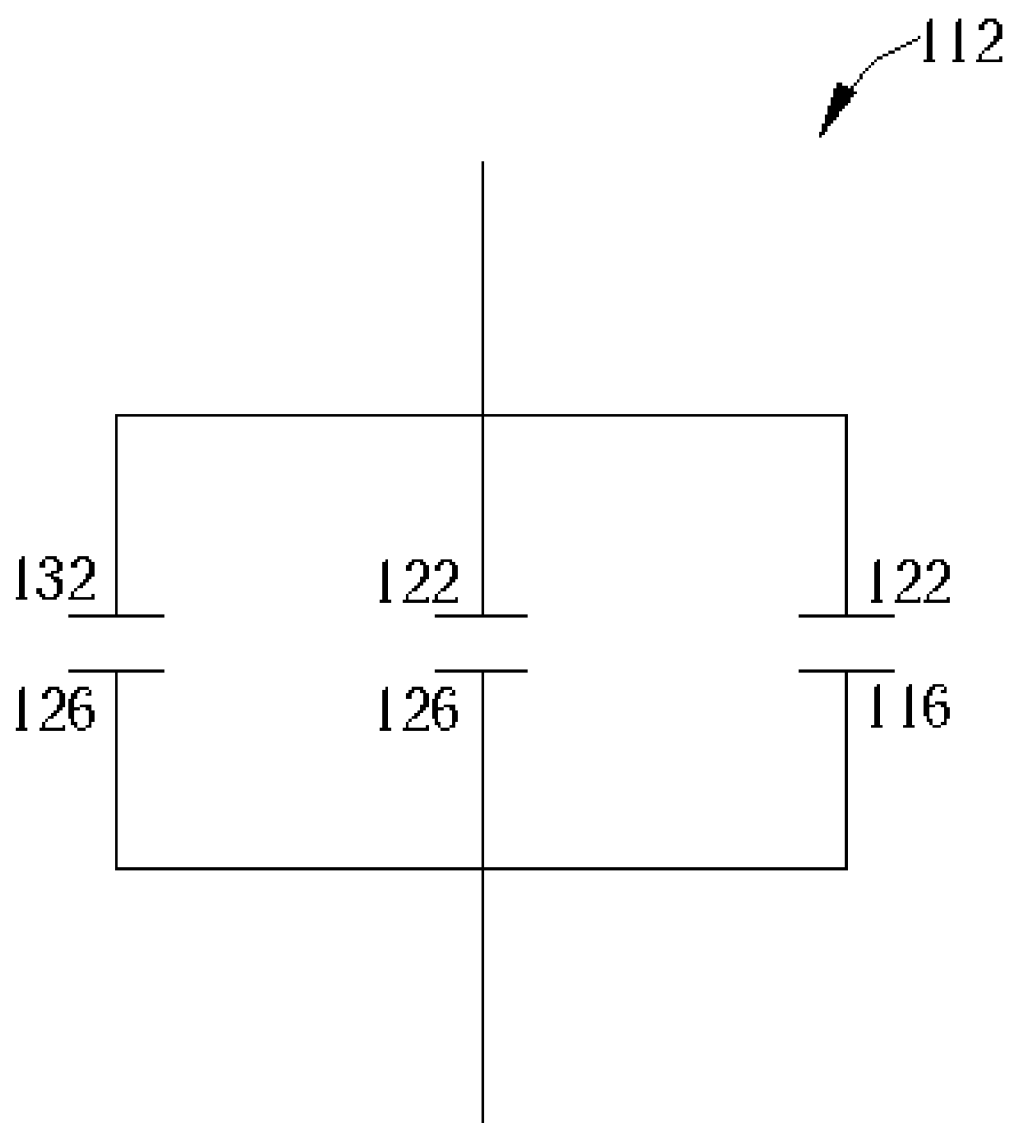
FIG. 4 is an equivalent circuit diagram of the storage capacitor shown in FIG. 3.

Referring to FIG. 4, FIG. 4 is an equivalent circuit diagram of the storage capacitor 112 shown in FIG. 3. As shown in FIG. 4, the storage capacitor 112, shown in FIG. 3, is an equivalent capacitor including the first capacitor, the second capacitor, and the third capacitor, shown in FIG. 3, connected in parallel with each other. The top electrode plate, the capacitor dielectric layer, and the bottom electrode plate of the first capacitor are the second conductive layer 122, the first insulating layer (not shown), and the first conductive layer 116, respectively. The top electrode plate, the capacitor dielectric layer, and the bottom electrode plate of the second capacitor are the second conductive layer 122, the second insulating layer (not shown), and the third conductive layer 126, respectively. The top electrode plate, the capacitor dielectric layer, and the bottom electrode plate of the third capacitor are the fourth conductive layer 132, the third insulating layer (not shown), and the third conductive layer 126, respectively. The second conductive layer 122 and the fourth conductive layer 132 are used as a positive electrode (or a negative) electrode) of the storage capacitor 112, and the second conductive layer 122 and the fourth conductive layer 132 are electrically connected by the fifth conductive layer 138 through the second contact hole 136. The first conductive layer 116 and the third conductive layer 126 are used as a negative electrode (or a positive electrode) of the storage capacitor 112, and the first conductive layer 116 and the third conductive layer 126 are electrically connected by the third conductive layer 126 through the first contact hole 134. Therefore, the capacitance value ($C_{ST}$) of the storage capacitor 112 is equal to the sum of the capacitance value of the first capacitor ($C_1$), the capacitance value of the second capacitor ($C_2$), and capacitance value of the third capacitor ($C_3$).

Furthermore, the present invention capacitor is not only disposed in the pixel array area on the array substrate of the liquid crystal display, but also is disposed in the periphery circuit area on the array substrate of the liquid crystal display. In the previous case, the capacitor is used as a storage capacitor; in the latter case, the capacitor is used as another capacitor depending on the requirement of circuit design. The present invention capacitor is not limited to application in thin film transistor liquid crystal displays, or low temperature polysilicon thin film transistor liquid crystal displays in the preferred embodiment of the present invention. In fact, the present invention capacitor may be applied to organic light emitting diodes (OLEDs), field emitting displays (FEDs), or other displays actively driven by thin film transistors.

Since the present invention capacitor structure replaces the planer capacitor made up of two-layered electrode plates with three stacked capacitors, comprising four prior art conductive layers as four-layered electrode plates, these three capacitors are connected in parallel with one another. Therefore, the capacitance value of the storage capacitor is equal to the sum of the capacitance values of these three capacitors. As a result, the area of the present invention capacitor structure is only approximately one third of the area of the prior art capacitor structure to store the same number of charges. Not only is the aperture ratio of the pixel increased, but also the maximum brightness of the liquid crystal display is improved to improve the insufficient overall contrast phenomenon that frequently occurs in the prior art. In addition, because the present invention capacitor structure utilizes the four conductive layers from the prior art, no extra cost is incurred from special treatment or considerations to fabricate very competitive products when applying the present invention capacitor structure to low temperature polysilicon thin film transistors or other products.

In comparison with prior art, the present invention capacitor structure replaces the planer capacitor having two-layered electrode plates with three stacked capacitors having four conductive layers from the prior art as four-layered electrode plates. Since these three capacitors are connected in parallel with one another, the capacitance value of the equivalent capacitor is equal to the sum of the capacitance values of these three capacitors. Therefore, the area of the present invention capacitor structure is only approximately one third of the area of the prior art capacitor structure to store the same number of charges. Not only is the aperture ratio of the pixel increased, but also the maximum brightness of the liquid crystal display is improved correspondingly to improve the insufficient overall contrast phenomenon frequently occurring in the prior art. Furthermore, because the present invention capacitor structure utilizes the four conductive layers from the prior art as four electrode plates, current processing techniques do not need to be changed when fabricating the present invention capacitor structure. By slightly alternating the layout of the pixel array area and the masks utilized for manufacturing, the present invention capacitor structure is formed without extra cost, owing to special treatments or consideration. As a result, the present invention capacitor structure is very commercially viable.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A capacitor structure comprising:
   a substrate;
   a first conductive layer disposed on the substrate;
   a first insulating layer disposed on the first conductive layer;
   a second conductive layer disposed on portions of the first insulating layer;
   a second insulating layer disposed on portions of the second conductive layer and the first insulating layer;
   a third conductive layer disposed on portions of the second insulating layer and electrically connecting to the first conductive layer through at least one first contact hole, the first contact hole being adjacent to the second conductive layer;
   a third insulating layer disposed on the third conductive layer and the second insulating layer; and
   a fourth conductive layer disposed on the third insulating layer and electrically connecting to the second conductive layer through at least one second contact hole and a fifth conductive layer, wherein the third conductive layer and the fifth conductive layer are made by a same patterned layer, and the capacitor structure is electrically connected to a thin film transistor (TFT) and the first conductive layer is not electrically connected to a gate of the TFT in a display.

2. The structure of claim 1 wherein the substrate comprises a glass substrate, a quartz substrate, or a plastic substrate.

3. The structure of claim 1 wherein the first conductive layer is a polysilicon layer.

4. The structure of claim 1 wherein the first insulating layer comprises a silicon oxide layer, a silicon nitride layer, or a silicon oxynitride layer.

5. The structure of claim 1 wherein both of the second conductive layer and the third conductive layer comprise a metal layer, an alloy layer, or a metal multi-layer.

6. The structure of claim 5 wherein the metal layer comprises a tungsten layer (W layer), a chrome layer (Cr layer), a titanium layer (Ti layer), an aluminum layer (Al layer), a niobium layer (Nb layer), or a molybdenum layer (Mo layer): the alloy layer comprises an aluminum-neodymium (AlNd) alloy, the metal multi-layer comprises a titanium/aluminum/titaniuin layer (Ti/Al/Ti layer), a molybdenwm/aluminum/ molybdenum layer (Mo/Al/Mo layer), or a chrome/aluminum (Cr/Al layer).

7. The structure of claim 1 wherein the fifth conductive layer is disposed in the second contact hole to electrically connect the fourth conductive layer and the second conductive layer.

8. The structure of claim 7 wherein the third conductive layer and the fifth conductive layer are not connected.

9. The structure of claim 7 wherein the substrate is an array substrate of the display, a pixel array area is included on a surface of the substrate, and the fourth conductive layer is electrically connected to the thin film transistor (TFT) in the pixel array area through the fifth conductive layer.

10. The structure of claim 9 wherein the capacitor structure is disposed in the pixel array area on the substrate to be used as a storage capacitor.

11. The structure of claim 1 wherein the substrate is an array substrate of the display, a periphery circuit area is included on a surface of the substrate, and the capacitor structure is disposed in the periphery circuit area on the substrate.

12. The structure of claim 1 wherein the second insulating layer comprises a silicon oxide layer, a silicon nitride layer, or a silicon oxynitride layer.

13. The structure of claim 1 wherein the first contact hole is disposed in the first insulating layer and the second insulating layer, and the first contact hole exposes portions of the first conductive layer.

14. The structure of claim 1 wherein the third insulating layer comprises a silicon oxide layer, a silicon nitride layer, or a silicon oxynitride layer.

15. The structure of claim 1 wherein the fourth conductive layer comprises an indium tin oxide layer (ITO layer) or an indium zinc oxide layer (IZO layer).

16. The structure of claim 1 wherein the second contact hole is disposed in the second insulating layer, and the second contact hole exposes portions of the second conductive layer.

17. The structure of claim 1 wherein the first conductive layer, the first insulating layer, and the second conductive layer form a first capacitor; the second conductive layer, the second insulating layer, and the third conductive layer form a second capacitor; and the third conductive layer, the third insulating layer, and the fourth conductive layer form a third capacitor.

18. The structure of claim 17 wherein the second conductive layer and the fourth conductive layer are used as a positive electrode of the capacitor, and the second conductive layer and the fourth conductive layer are electrically connected by the fifth conductive layer through the second contact hole; the first conductive layer and the third conductive layer are used as a negative electrode of the capacitor, and the first conductive layer and the third conductive layer are electrically connected through the first contact hole filled with the third conductive layer.

19. The structure of claim 17 utilizing multi-layered conductive layers as multi-layered electrode plates to form at least two stack capacitors.

20. The structure of claim 17 wherein the capacitance value of the capacitor is equal to the capacitance value of an equivalent capacitor including the first capacitor, the second capacitor, and the third capacitor connected in parallel with one another.

21. The structure of claim 9, wherein the gate and the capacitor are in the pixel array area.

* * * * *